(12) United States Patent
Ito et al.

(10) Patent No.: US 6,225,700 B1
(45) Date of Patent: *May 1, 2001

(54) PACKAGE FOR A SEMICONDUCTOR ELEMENT HAVING DEPRESSIONS CONTAINING SOLDER TERMINALS

(75) Inventors: Nobuyuki Ito; Shin Matsuda, both of Kokubu (JP)

(73) Assignee: Kyocera Corporation, Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/567,949

(22) Filed: Dec. 6, 1995

(30) Foreign Application Priority Data

Dec. 8, 1994 (JP) .................................................. 6-304718
Dec. 8, 1994 (JP) .................................................. 6-304719
Dec. 8, 1994 (JP) .................................................. 6-304720

(51) Int. Cl.$^7$ ................................................... H01L 23/48
(52) U.S. Cl. ........................ 257/780; 257/704; 257/738; 257/779
(58) Field of Search ............................... 257/697, 704, 257/738, 774, 778, 779, 780, 781, 734; 438/108, 613

(56) References Cited

U.S. PATENT DOCUMENTS

| | | | |
|---|---|---|---|
| 4,764,804 | * | 8/1988 | Sahara et al. .................... 438/613 |
| 5,093,986 | * | 3/1992 | Mandai et al. .................... 29/843 |
| 5,216,278 | * | 6/1993 | Lin et al. ........................... 257/737 |
| 5,293,072 | * | 3/1994 | Tsuji et al. ........................ 257/738 |
| 5,397,917 | * | 3/1995 | Ommen et al. .................... 257/778 |
| 5,468,655 | * | 11/1995 | Greer ................................. 257/738 |
| 5,473,512 | * | 12/1995 | Degani et al. .................... 257/778 |
| 5,512,786 | * | 4/1996 | Imamura et al. .................. 257/780 |

FOREIGN PATENT DOCUMENTS

| | | | | |
|---|---|---|---|---|
| 000260969 | * | 3/1988 | (EP) .................................. 257/779 |
| 36 2266857 | * | 11/1987 | (JP) .................................. 257/738 |
| 40 2178957 | * | 4/1990 | (JP) .................................. 257/779 |

\* cited by examiner

*Primary Examiner*—Olik Chaudhuri
*Assistant Examiner*—Alonzo Chambliss
(74) *Attorney, Agent, or Firm*—Hogan & Hartson, LLP.

(57) ABSTRACT

A package for housing a semiconductor element includes a substrate of electrically insulating material and having a semiconductor element-mounting portion at an upper surface thereof onto which the semiconductor element is mounted. The substrate has a plurality of depression portions at a lower surface thereof, and a plurality of metallized wiring layers lead out from the periphery of the semiconductor element-mounting portion and extend to the bottom surfaces of the depression portions. A plurality of connection pads formed on the bottom surfaces of the depression portions are electrically connected to the metallized wiring layers. Terminals which are attached to the connection pads each have a ball-like protruding portion at the lower surface of the insulating substrate and comprise non-eutectic solder. The package may be provided with metallic pads formed on the lower surface of the insulating substrate, and metallic balls attached to the metallic pads.

8 Claims, 2 Drawing Sheets

PACKAGE FOR A SEMICONDUCTOR ELEMENT HAVING DEPRESSIONS CONTAINING SOLDER TERMINALS

BACKGROUND OF THE INVENTION

1. Field of the Invention

This invention relates to a package for a semiconductor element for the purpose of housing a semiconductor integrated circuit element such as an LSI device.

2. Description of the Related Art

A conventional package for housing a semiconductor integrated circuit element such as semiconductor elements in particular, an LSI device (large-scale integrated circuit element), usually comprises an insulating substrate which is composed of an electrically insulating material such as an alumina ceramic and has a semiconductor element-mounting portion for housing a semiconductor integrated circuit element nearly at a middle top surface thereof; a plurality of metallized wiring layers composed of powder of a high-melting point metal such as tungsten or molybdenum which lead out from the periphery of the semiconductor element-mounting portion of the insulating substrate to a lower surface thereof; a plurality of connection pads formed on the lower surface of the insulating substrate to which the metallized wiring layers are connected; ball-like terminals composed of solder (eutectic solder with a weight ratio of lead and tin of 4:6) soldered to the connection pads; and a lid. The package for housing a semiconductor element is fabricated as a product by securely bonding the semiconductor integrated circuit element to the bottom surface of the semiconductor element-mounting portion of the insulating substrate by means of an adhesive such as glass or resin while electrically connecting each electrode of the semiconductor integrated circuit element to the metallized wiring layer by means of a bonding wire, bonding the lid to the upper surface of the insulating substrate by means of a sealing material such as glass or resin, and then hermetically sealing the semiconductor integrated circuit element inside a container which comprises the insulating substrate and the lid.

This type of semiconductor device is mounted to an external electric circuit board by bringing the terminals composed of solder soldered to the connection pads on the lower surface of the insulating substrate into contact with a wire conductor of the external electric circuit board and then thermally fusing the terminals at a temperature of from about 200 to 250° C. to bond the terminals to the wire conductors. Simultaneously, each electrode of the semiconductor integrated circuit element housed inside the package for housing a semiconductor integrated circuit element is electrically connected to the external electronic circuit through the metallized wiring layer and the terminal.

However, in contrast to the fact that the thermal expansion coefficient of the insulating substrate composed of, for example, alumina ceramic is about $6.5\times10^{-5}$/° C. in a conventional package for housing a semiconductor element, the external electric circuit board is usually composed of glass epoxy resin with a thermal expansion coefficient from $2\times10^{-5}$/° C. to $4\times10^{-5}$/° C. Because both thermal expansion coefficients differ greatly, when a semiconductor integrated circuit element is housed inside a package for housing a semiconductor element and then mounted to an external electric circuit board, heat generated while the semiconductor integrated circuit element is operating is repeatedly applied to both the insulating substrate and the external electric circuit board, a large thermal stress occurs between the insulating substrate of the package for housing a semiconductor element and the external electric circuit board due to the difference of both thermal expansion coefficients. This thermal stress acts on the external periphery of the connection pads of the lower surface of the insulating substrate, and makes the connection pads peel off from the insulating substrate. Because of that, such package has a drawback in that it is incapable of electrically connecting each electrode of the semiconductor integrated circuit element housed inside the package to a predetermined external electronic circuit for long periods of time.

Thereupon, to eliminate the above-mentioned drawback, the present inventors previously proposed a package for housing a semiconductor element in that terminals composed of eutectic solder are attached to the connection pads which had been attached to the bottom surface of depression portions provided on a lower surface of the insulating substrate to form protruding portions on the lower surface of the insulating substrate. According to this type of package for housing a semiconductor element, the thermal stress that occurs between the insulating substrate and the external electric circuit board due to the difference of both thermal expansion coefficients is reduced by being dispersed to terminals positioned at the external periphery of the connection pads and the opening of the depression portion of the insulating substrate, thereby resulting in effectively preventing the peeling of the connection pads from the insulating substrate.

However, in this package for housing a semiconductor element, since the terminals are formed of eutectic solder and all the terminals are simultaneously fused by heating and solidified, when the semiconductor device is mounted to the external electric circuit board by thermally fusing and then bonding the terminals to the wire conductors of the external electric circuit board, all the terminals are virtually and simultaneously fused, becoming a liquid state along with a part of the liquified solder positioned inside the depression portion of the insulating substrate being absorbed in the protruding portion of the lower surface of the insulating substrate by means of surface tension. This leads to a drawback that the area between the protruding portion of the terminals and the region inside the depression portion is divided up and it will become impossible to firmly, electrically connect each electrode of the semiconductor integrated circuit element to the external electronic circuit.

Furthermore, if the package for housing a semiconductor element is additionally large in shape and the total weight heavy, when the package for housing a semiconductor element is mounted to the external electric circuit board by thermally fusing the ball-like terminals soldered to the connection pads on the lower surface of the insulating substrate and bonding these ball-like terminals to the wire conductors of the external electric circuit board, the thermally fused ball-like terminals are crushed by the weight of the package for housing a semiconductor element and are spread between the lower surface of the insulating substrate and the external electric circuit board. This results in a drawback that it will become difficult to electrically connect each ball-like terminal to a predetermined external electronic circuit with reliability, while causing electrical short-circuits between adjacent ball-like terminals.

SUMMARY OF THE INVENTION

This invention, having been accomplished in consideration of the above-mentioned drawbacks, is aimed at providing a package for housing a semiconductor element that can securely and electrically connect each electrode of a semiconductor integrated circuit element housed inside the package to a predetermined external electronic circuit for long periods of time.

According to this invention, there is provided:

A package for housing a semiconductor element, the package comprising:

an insulating substrate comprising an electrically insulating material, the insulating substrate having a semiconductor element-mounting portion at an upper surface thereof onto which the semiconductor element is mounted as well as having a plurality of depression portions at a lower surface thereof;

a plurality of metallized wiring layers which lead out from the periphery of the semiconductor element-mounting portion and extend to the bottom surface of the depression portions;

a plurality of connection pads formed on the bottom surface of the depression portions of the insulating substrate, the plurality of connection pads being electrically connected to the metallized wiring layers; and terminals which are attached to the connection pads, the terminal having a ball-like protruding portion at the lower surface of the insulating substrate and being formed of non-eutectic solder.

According to this invention, there is also provided:

A package for housing a semiconductor element, the package comprising:

an insulating substrate comprising an electrically insulating material, the insulating substrate having a mounting portion at an upper surface thereof onto which the semiconductor element is mounted as well as having a plurality of depression portions at a lower surface thereof;

a plurality of metallized wiring layers which lead out from the periphery of the mounting portion and extend to the bottom surface of the depression portions;

a plurality of connection pads formed on the bottom surface of the depression portions of the insulating substrate, the plurality of connection pads being electrically connected to the metallized wiring layers;

terminals which are attached to the connection pads, the terminal having a ball-like protruding portion at the lower surface of the insulating substrate and comprising solder;

metallic pads formed on the lower surface of the insulating substrate; and metallic balls which are attached to the metallic pads.

Furthermore, in the package for housing a semiconductor element of this invention, the metallic balls are formed of copper and the metallic pads onto which the metallic balls are attached are formed in a region opposite to the mounting portion of the insulating substrate onto which is the semiconductor element mounted.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
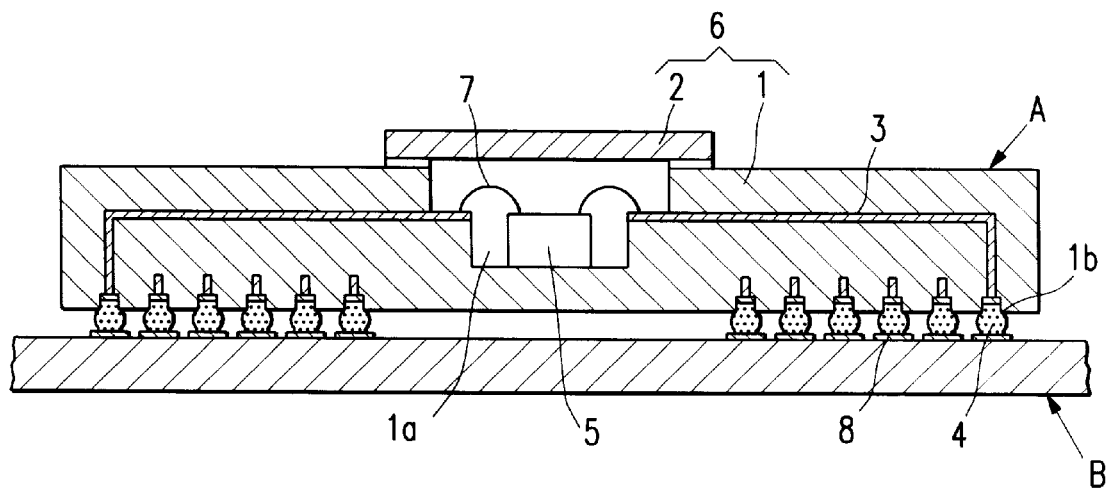
FIG. 1 is a sectional view illustrative of an embodiment of the package for housing a semiconductor element according to this invention.

Now referring to the drawings, preferred embodiments of the invention are described below.

Figure 2:
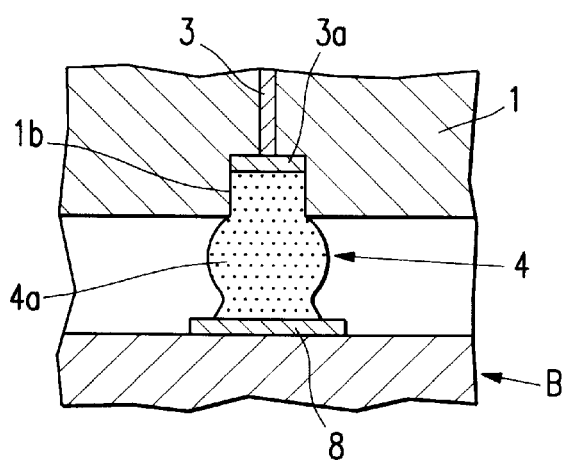
FIG. 2 is an expanded sectional view of the main portions of FIG. 1

FIG. 1 and FIG. 2 show an embodiment of the package for housing a semiconductor element according to this invention. A is a semiconductor device manufactured by using the package for housing a semiconductor element according to this invention and B is an external electric circuit board.

The semiconductor device A is assembled by hermetically sealing a semiconductor integrated circuit element 5 inside the package for housing a semiconductor element which comprises an insulating substrate 1, a lid 2, metallized wiring layers 3 and terminals 4. The insulating substrate 1 and the lid 2 of the package for housing a semiconductor element comprises a container 6 for hermetically sealing the semiconductor integrated circuit element 5 inside.

The insulating substrate 1 that forms the package for housing a semiconductor element is provided with a semiconductor element-mounting portion 1a on its upper surface at the center portion onto which the semiconductor integrated circuit element 5 is mounted and sealed. The semiconductor integrated circuit element 5 is adhered to the bottom surface of the semiconductor element-mounting portion 1a by means of an adhesive such as glass or resin.

The insulating substrate 1 is composed of an electrically insulating material such as aluminum oxide sinter, mullite sinter, silicon carbide sinter, aluminum nitride sinter or glass ceramic sinter. For example, when the insulating substrate is composed of aluminum oxide sinter, it is manufactured by adding and mixing a suitable organic binder, a plasticizer or a solvent with powder of a starting material such as aluminum oxide, silicon dioxide, magnesium oxide or calcium oxide to form a slurry. Then, this slurry is formed into a green sheet (raw sheet) according to the doctor blade method or calendar roll method, thereafter a suitable stamping process is carried out on the green sheet and a plurality of layers are laminated and then fired at a temperature of approximately 1600° C.

Further, the insulating substrate 1 has a plurality of metallized wiring layers 3 attached thereto extending from the periphery of the semiconductor element-mounting portion 1a onto which the semiconductor integrated circuit element 5 is mounted and housed to the lower surface of the insulating substrate 1. As also shown in FIG. 2, depression portion 1b is provided on the lower surface of the insulating substrate 1 and on the bottom surface of this depression portion 1b a connection pad 3a is attached and formed, which is electrically connected to the metallized wiring layer 3.

The metallized wiring layers 3 and connection pad 3a are composed of a high-melting point metal powder such as tungsten, molybdenum or manganese and are attached and formed in a predetermined pattern at a designated position on the insulating substrate 1 by applying a metal paste obtained by adding and mixing a suitable organic binder, a plasticizer or a solvent with a high-melting point metal powder such as tungsten in a specified pattern on a green sheet which will become the insulating substrate 1 using a conventional screen printing method.

The metallized wiring layer 3 functions to electrically connect each electrode of the semiconductor integrated circuit element 5 to a terminal 4 which is attached to a connection pad 3a (described later) and each electrode of the semiconductor integrated circuit element 5 is electrically connected by means of a bonding wire to a region positioned at the periphery of the semiconductor element-mounting portion 1a of the insulating substrate 1.

Furthermore, the connection pad 3a which is electrically connected to the metallized wiring layer 3 functions as a base metallic layer when the terminal 4 is attached to the insulating substrate 1 and the terminal 4 which is attached to the surface of the connection pad 3a is composed of non-eutectic solder (tin-lead alloy).

Even further, the terminal 4 attached to the connection pad 3a has a ball-like protruding portion 4a on the lower surface of the insulating substrate 1. The terminal 4 which has the ball-like protruding portion 4a connects the connection pad 3a onto which is connected each electrode of the semiconductor integrated circuit element 5 to a wire conductor 8 of an external electric circuit board B as well as functions to mount the semiconductor device A onto the external electric circuit board B.

The package for housing a semiconductor element which comprises the insulating substrate 1, the lid 2, the metallized wiring layers 3 and the terminal 4 is made into the semiconductor device A by securely bonding the semiconductor integrated circuit element 5 to the bottom surface of the semiconductor element-mounting portion 1a of the insulating substrate 1 by means of an adhesive such as glass, resin or solder. In addition, each electrode of the semiconductor integrated circuit element 5 is electrically connected to the metallized wiring layer 3 by means of a bonding wire 7, then the lid 2 is bonded to the upper surface of the insulating substrate 1 by means of a sealing material composed of glass or resin, and thereafter the semiconductor integrated circuit element 5 is hermetically sealed inside the container 6 comprising the insulating substrate 1 and the lid 2.

Furthermore, the semiconductor device A is mounted to the top of the external electric circuit board B by placing the terminal 4 composed of solder which is attached to the connection pad 3a on the lower surface of the insulating substrate 1 to make contact with the wire conductor 8 of the external electric circuit board B and then thermally fusing the terminal 4 at a temperature of from about 200 to about 250° C., and bonding the terminal 4 to the wire conductor 8.

The terminal 4 is attached to the connection pad 3a which is attached to the bottom surface of the depression portion 1b provided on the lower surface of the insulating substrate 1 such that the ball-like protruding portion 4a forms on the lower surface of the insulating substrate 1. Then, after mounting the semiconductor device A to the top of the external electric circuit board B, heat that is generated during the operation of the semiconductor integrated circuit element 5 is repeatedly applied to both the insulating substrate 1 and the external electric circuit board B with a large thermal stress which may occur due to the difference of the thermal expansion coefficients between the insulating substrate 1 and the external electric circuit board B. That thermal stress is reduced by being dispersed to both the periphery of the connection pad 3a and the terminal 4 positioned at the opening region of the depression portion 1b at the lower surface of the insulating substrate 1. This results in preventing the connection pads 3a from peeling off from the insulating substrate 1 as well as makes it possible to reliably, securely and electrically connect each electrode of the semiconductor integrated circuit element 5 housed inside the container 6 to the external electronic circuit for long periods of time by means of the bonding wire 7, the metallized wiring layer 3, the connection pad 3a and the terminal 4.

Because a terminal 4 is formed of non-eutectic solder, when it is thermally fused and bonded to a wire conductor 8 of the external electric circuit board B, a liquid phase and a solid phase are simultaneously formed on the terminal 4 and the liquid phase solder positioned inside the depression portion 1b of the insulating substrate 1 is effectively prevented from being absorbed due to the solid phase solder into the protruding portion 4a which protrudes to the lower surface of the insulating substrate 1. This eliminates any dividing of the area between the protruding portion 4a of the terminal 4 and the region inside the depression portion 1b, thereby allowing each electrode of the semiconductor integrated circuit element 5 to be securely, electrically connected to the external electronic circuit.

In cases where the terminal 4, composed of non-eutectic solder (a tin-lead alloy), comprises 72% or more by weight of tin and 28% or less by weight of lead or comprises 68% or less by weight of tin and 42% or more by weight of lead, the terminal 4 composed of solder gradually liquifies, and it becomes possible to securely, electrically connect each electrode of the semiconductor integrated circuit element 5 with the external electric circuit.

Furthermore, the external electric circuit board B on which the semiconductor device A is mounted is composed of, for example, an electrically insulating material such as glass epoxy resin and on the top surface of that the wire conductor 8 composed of a material with good conductive properties such as copper is attached.

The external electric circuit board B functions as a support member to support the semiconductor device A and the wire conductor 8 functions to connect each electrode of the semiconductor integrated circuit element 5 of the semiconductor device A to the predetermined external electronic circuit.

Further, the external electric circuit board B that has the wire conductor 8 on its upper surface is, for example, manufactured by attaching a film composed of copper to the upper surface of a glass epoxy resin plate by means of an adhesive and then processing the copper film into a predetermined pattern using an etching method.

As shown in FIG. 2, the wire conductor 8 attached to the upper surface of the external electric circuit board B is wider than the surface area of the connection pad 3a which is attached to the bottom surface of the depression portion 1b provided on the lower surface of the insulating substrate 1 of the semiconductor device A and the bonding surface area against the wire conductor 8 of the terminal 4 is wider than the surface area of the connection pad 3a. For this case, because the bonding surface area between the wire conductor 8 of the external electric circuit board B and the terminal 4 is wider compared to the surface area of the connection pad 3a, the bonding strength of the terminal 4 against the wire conductor 8 of the external electric circuit board B is extremely strong, thereby the terminal 4 does not peel from the wire conductor 8 because of thermal stress occurring due to the difference between the thermal expansion coefficients of the insulating substrate 1 and the external electric circuit board B. This makes it possible to reliably, securely and electrically connect each electrode of the semiconductor integrated circuit element 5 housed inside the container 6 to the predetermined external electronic circuit for long periods of time.

Furthermore, if the bonding surface area between the wire conductor 8 which is attached to the upper surface of the external electric circuit board B and the terminal 4 is made to be wider than the surface area of the connection pad 3a by 25% or more, the bonding strength of the terminal 4 against the wire conductor 8 of the external electric circuit board B can be extremely strong without any peeling from the wire conductor 8 of the terminal 4. Therefore, it is preferable for the bonding surface area between the wire conductor 8 which is attached to the upper surface of the external electric circuit board B and the terminal 4 to be wider than the surface area of the connection pad 3a by 25% or more.

Figure 3:
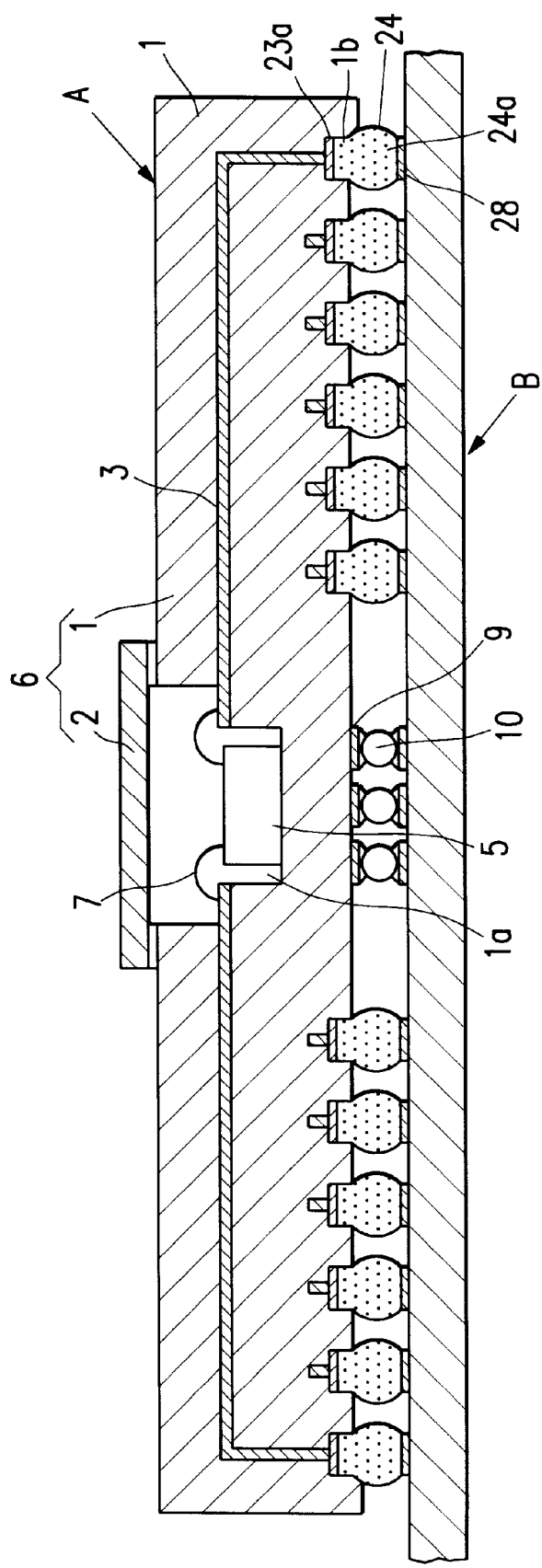
FIG. 3 is a sectional view illustrative of another embodiment of the package for housing a semiconductor element according to this invention.

FIG. 3 shows the package for housing a semiconductor element according to another embodiment of this invention. The description of elements that are given identical reference numbers with those in FIG. 1 is omitted.

A depression portion 1b is provided on the lower surface of the insulating substrate 1 and on the bottom surface of this depression portion 1b a connection pad 23a is attached and formed, which is electrically connected to metallized bring layer 3.

The metallized wiring layer 3 and connection pad 23a are formed at a designated position of the insulating substrate 1 in a predetermined pattern according to the same method as in the first embodiment.

The metallized wiring layer 3 functions to electrically connect each electrode of the semiconductor integrated circuit element 5 to a terminal 24 which is attached to the connection pad 23a (described later) and each electrode of the semiconductor integrated circuit element 5 is electrically connected to a region positioned at the periphery of the semiconductor element-mounting portion 1a of the insulating substrate 1 by means of a bonding wire 7.

The connection pad 23a which is electrically connected to the metallized wiring layer 3 functions as a base metallic layer when the terminal 24 is attached to the insulating substrate 1, and the terminal 24 composed of non-eutectic solder is attached to the surface of the connection pad 23a.

The terminal 24 which is attached to the connection pad 23a has a ball-like protruding portion 24a at the lower surface of the insulating substrate 1 and this ball-like protruding portion 24a functions to make the connection simple and reliable when the terminal 24 is connected to a wire conductor 28 of the external electric circuit board B.

Because the terminal 24 has the ball-like protruding portion 24a at the lower surface of the insulating substrate 1, after the terminal 24 is bonded to the wire conductor 28 of the external electric circuit board B, heat that is generated during the operation of the semiconductor integrated circuit element 5 is repeatedly applied to both the insulating substrate 1 and the external electric circuit board B with a large thermal stress which may occur due to the difference of the thermal expansion coefficients between both the insulating substrate 1 and the external electric circuit board B. That thermal stress is reduced by being dispersed to both the outer periphery of the connection pad 23a and the terminal 24 positioned at the opening region of the depression portion 1b of the insulating substrate 1. This results in preventing the connection pad 23a from peeling off from the insulating substrate 1 due to the thermal stress as well as makes it possible to electrically connect each electrode of the semiconductor integrated circuit element 5 housed inside the container 6 to the predetermined external electronic circuit for long periods of time.

According to the package for housing a semiconductor element in this embodiment metal pads 9 are attached to the lower surface of the insulating substrate 1 and metal balls 10 are attached to the metal pads 9.

The metal pad 9 functions as a base metallic layer when the metal ball 10 is attached to the lower surface of the insulating substrate 1 and is formed of tungsten, molybdenum or manganese.

Utilizing the method similar to that used for the metallized wiring layers 3, namely, the metal pad 9 is attached and formed in a specified pattern at a designated position on the lower surface of the insulating substrate 1 by applying a metal paste obtained by adding and mixing a suitable organic binder, a plasticizer or a solvent with a high-melting point metal powder such as tungsten in a predetermined pattern on a green sheet which will become the insulating substrate 1 using a conventional screen printing method.

Further, the metal ball 10 is attached to the metal pad 9 by means of a soldering material such as solder and this metal ball 10 functions to form a fixed gap between the lower surface of the insulating substrate 1 and the upper surface of the external electric circuit board B while the package for housing a semiconductor element is mounted onto the external electric circuit board B by thermally fusing the terminal 24 composed of solder which is attached to the connection pad 23a on the lower surface of the insulating substrate 1 and then bonding the terminal 24 to the wire conductor 28 of the external electric circuit board B. Thus, the thermally fused terminal 24 completely eliminates the possibility of being crushed even if the weight of the package for housing a semiconductor element is heavy thereby, each terminal 24 can be reliably, electrically connected to the predetermined external electronic circuit along with making it possible to maintain electrical independence between adjacent terminals 24.

Moreover, when the metal pad 9 is formed in a region opposite to the semiconductor element-mounting portion 1a where the semiconductor integrated circuit element 5 of the insulating substrate 1 is mounted and sealed together and the metal ball 10 which is attached to the metal pad 9 is formed of copper which has excellent heat conductive properties, a large quantity of heat that may be generated during the operation of the semiconductor integrated circuit element 5 can be efficiently radiated to the external electric circuit board B or to the outside air through the metal ball 10. Thereby, high temperatures that give rise to heat damage or performance degradation in the semiconductor integrated circuit element 5 are completely eliminated, allowing the semiconductor integrated circuit element 5 to be reliably and normally operated over long periods of time at an always low temperature. Therefore, it is preferable for the metal pad 9 to be formed in the region opposite to the semiconductor element-mounting portion 1a where the semiconductor integrated circuit element 5 is mounted and sealed as well as the metal ball 10 to which the metal pad 9 is attached to be formed of cooper which has excellent heat conductive properties.

According to the second embodiment of the package for housing a semiconductor element of this invention, a semiconductor device A is manufactured as a product by adhering the semiconductor integrated circuit element 5 to the bottom surface of the semiconductor element-mounting portion 1a of the insulating substrate 1 by means of an adhesive, electrically connecting each electrode of the semiconductor integrated circuit element 5 to the metallized wiring layer 3 by means of the bonding wire 7, thereafter bonding the lid 2 to the upper surface of the insulating substrate 1 by means of a sealing material composed of glass or resin, and then hermetically sealing the semiconductor integrated circuit element 5 inside the container 6 which comprises the insulating substrate 1 and the lid 2.

Furthermore, the semiconductor device A is mounted onto the external electric circuit board B by bonding the terminal 24 of the lower surface of the insulating substrate 1 to the wire conductor 28 of the external electric circuit board B and, simultaneously, each electrode of the semiconductor integrated circuit element 5 housed inside the container 6 is electrically connected to the wire conductor 28 of the external electric circuit board B by means of the bonding wire 7, the metallized wiring layer 3, the connection pad 23a and the terminal 24.

Still further, where the surface area of the wire conductor 28 of the external electric circuit board B where the semiconductor device A is mounted is made wider than the surface area of the connection pad 23a which is attached to the bottom surface of the depression portion 1b provided on the lower surface of the insulating substrate 1 of the semiconductor device A, the bonding strength of the terminal 24 against the wire conductor 28 of the external electric circuit board B becomes extremely strong because of the bonding surface area between the wire conductor 28 of the external electric circuit board B and the terminal 24 being wider compared to the surface area of the connection pad 23a when the package for housing a semiconductor element is mounted onto the external electric circuit board B by thermally fusing the terminal 24 composed of solder which is attached to the connection pad 23a on the lower surface of the insulating substrate 1 and bonding the terminal 24 to the wire conductor 28 of the external electric circuit B. Any thermal stress that may result from the difference of the thermal expansion coefficients between the insulating substrate 1 and the external electric circuit board B would not make the terminal 24a peel off from the wire conductor 28. Thereby, it becomes possible to reliably, securely and electrically connect each electrode of the semiconductor integrated circuit element 5 housed inside the container 6 to the external electronic circuit for long periods of time.

Furthermore, where the bonding surface area between the wire conductor 28 which is attached to the upper surface of the external electric circuit board B and the terminal 24 is made to be wider than the surface area of the connection pad 23a by 25% or more, the bonding strength of the terminal 24 against the wire conductor 28 of the external electric circuit board B can be extremely strong without any peeling from the wire conductor 28 of the terminal 24. Therefore, it is preferably for the bonding surface area between the wire conductor 28 which is attached to the upper surface of the external electric circuit board B and the terminal 24 to be wider than the surface area of the connection pad 23a by 25% or more.

The invention may be embodied in other specific forms without departing from the spirit of essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A package for housing a semiconductor element, the package comprising:

an insulating substrate comprising an electrically insulating material, the insulating substrate having a semiconductor element-mounting portion at an upper surface thereof onto which the semiconductor element is mounted as well as having a plurality of depression portions of generally cylindrical configuration and of given diameter at a lower surface thereof;

a plurality of metallized wiring layers which lead out from the periphery of the semiconductor element-mounting portion and extend to the bottom surface of the depression portions at generally right angles thereto;

a plurality of generally disk-shaped connection pads formed on the bottom surface of the depression portions of the insulating substrate and having a diameter approximately equal to the given diameter of the depression portions, the plurality of connection pads being electrically connected to the metallized wiring layers; and terminals which are attached to the connection pads, the terminal extending from the connection pad through the depression portion to a ball-shaped protruding portion thereof at the lower surface of the insulating substrate and being integrally formed of non-eutectic solder.

2. The package according to claim 1, wherein the terminal which is integrally formed of non-eutectic solder is formed of either a tin-lead alloy comprising 72% or more by weight of tin and 28% or less by weight of lead, or a tin-lead alloy comprising 58% or less by weight of tin and 42% or more by weight of lead.

3. The package according to claim 1 where each of the plurality of generally disk-shaped connection pads has a relatively flat surface to which one of the terminals is attached, the relatively flat surface being a surface of diameter equal to the diameter of the connection pad, the terminals are bonded to wire conductors provided on the upper surface of an external electric circuit board through the ball-shaped protruding portion and a bonding surface of the terminal against the wire conductor of the external electric circuit board is a flat circular surface of diameter substantially greater than the diameter of the relatively flat surface of the connection pad to which one of the terminals is attached.

4. The package according to claim 3, wherein the diameter of the bonding surface of the terminal against the wire conductor of the external circuit board is 25% or more greater than the diameter of the relatively flat surface of the connection pad to which one of the terminals is attached.

5. A package for housing a semiconductor element, the package comprising:

an insulating substrate comprising an electrically insulating material, the insulating substrate having a semiconductor element-mounting portion at an upper surface thereof onto which the semiconductor element is mounted as well as having a plurality of depression portions of generally cylindrical configuration and of given diameter at a lower surface thereof;

a plurality of metallized wiring layers which lead out from the periphery of the semiconductor element-mounting portion and extend to the bottom surface of the depression portions at generally right angles thereto;

a plurality of generally disk-shaped connection pads formed on the bottom surface of the depression portions of the insulting substrate and having a diameter approximately equal to the given diameter of the depression portions, the plurality of connection pads being electrically connected to the metallized wiring layers;

terminals which are attached to the connection pads, the terminal extending from the connection pad through the depression portion to a ball-shaped protruding portion thereof at the lower surface of the insulating substrate and being integrally formed of non-eutectic solder;

metallic pads formed on the lower surface of the insulating substrate; and metallic balls which are attached to the metallic pads.

6. The package according to claim 5, wherein the metallic balls comprise copper and the metallic pads are formed in a region opposite to the semiconductor element-mounting portion of the insulating substrate.

7. The package according to claim 3 where each of the plurality of generally disk-shaped connection pads has a relatively flat surface to which one of the terminals is attached, the relatively flat surface being a surface of diameter equal to the diameter of the connection pad, the terminals are bonded to wire conductors provided on the upper surface of an external electric circuit board through the ball-shaped protruding portion and a bonding surface of the terminal against the wire conductor of the external electric circuit board is a flat circular surface of diameter substantially greater than the diameter of the relatively flat surface of the connection pad to which one of the terminals is attached.

8. The package according to claim 7, wherein the diameter of the bonding surface of the terminal against the wire conductor of the external circuit board is 25% or more greater than the diameter of the relatively flat surface of the connection pad to which one of the terminals is attached.

* * * * *